US007632753B1

(12) United States Patent  (10) Patent No.: US 7,632,753 B1
Rusli et al.  (45) Date of Patent:  Dec. 15, 2009

(54) WAFER LEVEL PACKAGE UTILIZING LASER-ACTIVATED DIELECTRIC MATERIAL

(75) Inventors: Sukianto Rusli, Phoenix, AZ (US); Bob Shih-Wei Kuo, Tucson, AZ (US); Ronald Patrick Huemoeller, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 233 days.

(21) Appl. No.: 11/867,293

(22) Filed: Oct. 4, 2007

(51) Int. Cl.
*H01L 21/4763* (2006.01)
*H01L 21/44* (2006.01)
*H01L 23/04* (2006.01)
*H01L 23/52* (2006.01)
*H01L 23/48* (2006.01)
*H01L 29/40* (2006.01)
*H01L 23/538* (2006.01)

(52) U.S. Cl. .................. 438/637; 438/640; 438/678; 438/681; 257/698; 257/774; 257/E23.174

(58) Field of Classification Search ............... 438/637, 438/640, 678, 681; 257/698, 774, E23.174
See application file for complete search history.

(56) References Cited

U.S. PATENT DOCUMENTS

| | | | |
|---|---|---|---|
| 6,035,527 A | 3/2000 | Tamm | |
| 6,194,250 B1 | 2/2001 | Melton et al. | |
| 6,461,892 B2 * | 10/2002 | Beroz | 438/106 |
| 6,730,857 B2 | 5/2004 | Konrad et al. | |
| 6,740,964 B2 | 5/2004 | Sasaki | |
| 6,919,514 B2 | 7/2005 | Konrad et al. | |
| 6,987,661 B1 | 1/2006 | Huemoeller et al. | 361/312 |
| 7,242,081 B1 | 7/2007 | Lee | |
| 7,334,326 B1 | 2/2008 | Huemoeller et al. | 29/852 |
| 7,345,361 B2 | 3/2008 | Mallik et al. | |
| 7,372,151 B1 | 5/2008 | Fan et al. | |
| 2007/0273049 A1 | 11/2007 | Khan et al. | |
| 2007/0290376 A1 | 12/2007 | Zhao et al. | |
| 2008/0230887 A1 | 9/2008 | Sun et al. | |

OTHER PUBLICATIONS

Berry et al., "Thin Stacked Interposer Package", U.S. Appl. No. 11/865,617, filed Oct. 1, 2007.
Scanlan, "Package-on-package (PoP) with Through-mold Vias", *Advanced Packaging*, Jan. 2008, 3 pages, vol. 17, Issue 1, PennWell Corporation.
Kim et al., "Application of Through Mold Via (TMV) as PoP base package", 58th *ECTC Proceedings*, May 2008, Lake Buena Vista, FL, 6 pages, IEEE.

* cited by examiner

*Primary Examiner*—Luan C Thai
(74) *Attorney, Agent, or Firm*—Gunnison, McKay & Hodgson, L.L.P.; Serge J. Hodgson

(57) ABSTRACT

A method of forming a wafer level package includes attaching a laser-activated dielectric material to an integrated circuit substrate to form an assembly, the integrated circuit substrate including a plurality of electronic components having terminals on first surfaces thereof. The laser-activated dielectric material is laser activated and ablated with a laser to form laser-ablated artifacts in the laser-activated dielectric material and simultaneously to form an electrically conductive laser-activated layer lining the laser-ablated artifacts. The laser-ablated artifacts are filled using an electroless plating process in which an electrically conductive filler material is selectively plated on the laser-activated layer to form an embedded circuit pattern within the laser-activated dielectric material.

25 Claims, 6 Drawing Sheets

WAFER LEVEL PACKAGE UTILIZING LASER-ACTIVATED DIELECTRIC MATERIAL

BACKGROUND OF THE INVENTION

1. Field of the Invention

The present invention relates generally to packaging of electronic components. More particularly, the present invention relates to a method of fabricating a wafer level package and the resulting structure.

2. Description of the Related Art

To form a circuit pattern, features in a dielectric layer are filled with plated copper. Typically, this entails formation of the features in the dielectric layer, formation of an electrically conductive seed layer within the features, and filling of the features by plating copper on the electrically conductive seed layer within the features.

Although effective in producing a circuit pattern, the multi-step process is inherently slow and thus has a high associated cost.

SUMMARY OF THE INVENTION

In accordance with one embodiment, a method of forming a wafer level package includes attaching a laser-activated dielectric material to an integrated circuit substrate to form an assembly, the integrated circuit substrate including a plurality of electronic components having terminals on first surfaces thereof.

The laser-activated dielectric material is laser activated and ablated with a laser to form laser-ablated artifacts in the laser-activated dielectric material and simultaneously to form an electrically conductive laser-activated layer lining the laser-ablated artifacts. The laser-ablated artifacts are filled using an electroless plating process in which an electrically conductive filler material is selectively plated on the laser-activated layer to form an embedded circuit pattern within the laser-activated dielectric material.

In the above manner, the embedded circuit pattern is formed with a minimal number of operations and thus at low cost.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
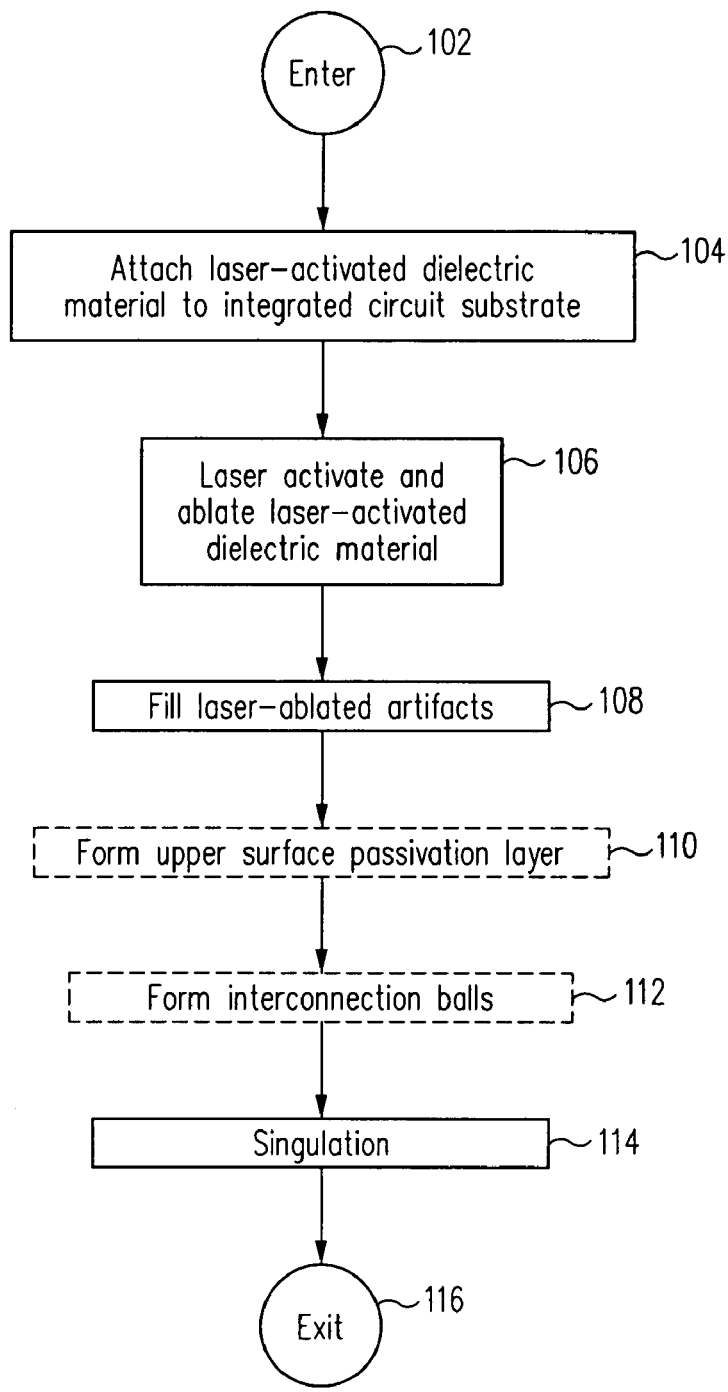
FIG. 1 is a wafer level package utilizing laser-activated dielectric material formation method in accordance with one embodiment of the present invention.
Figure 2:
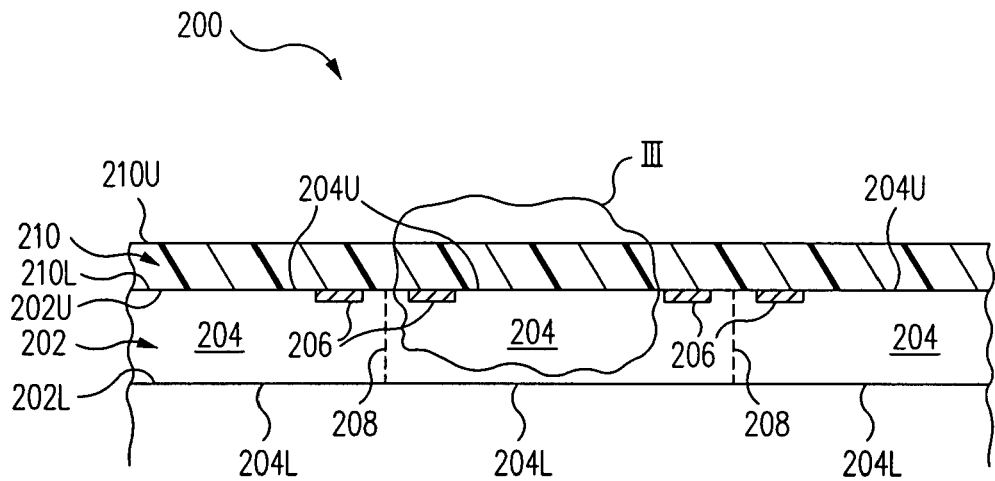
FIG. 2 is a cross-sectional view of an assembly during fabrication in accordance with one embodiment.
Figure 3:
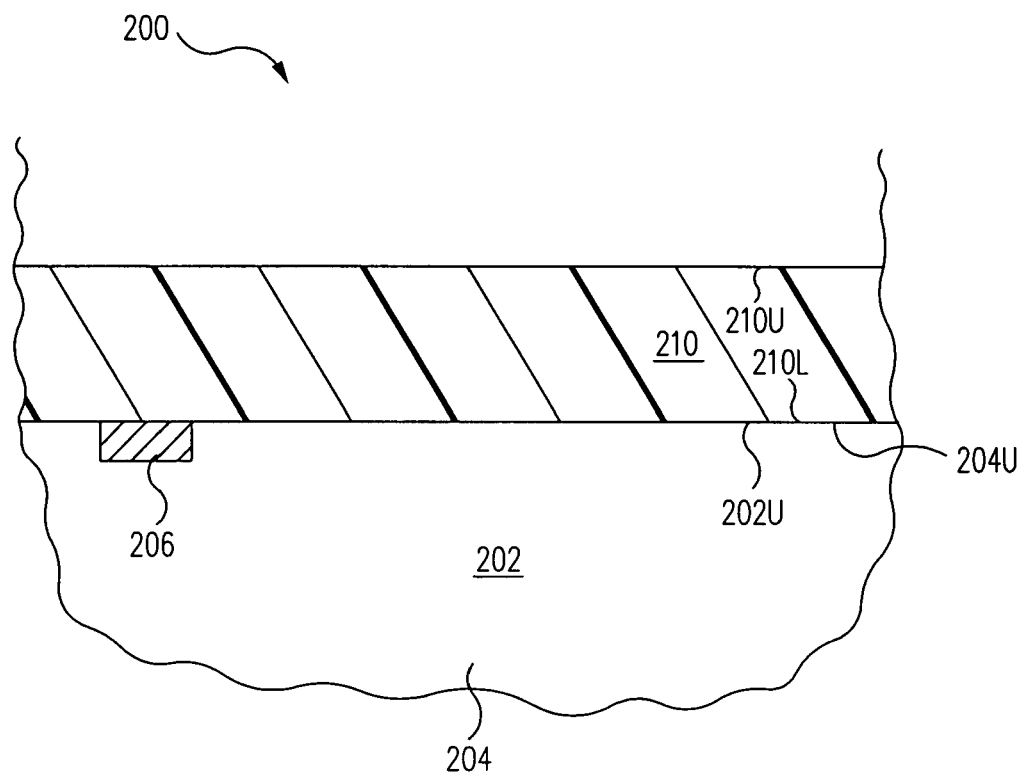
FIG. 3 is an enlarged cross-sectional view of a region III of the assembly of FIG. 2.

In accordance with one embodiment, referring to FIGS. 1, 2 and 3 together, a method 100 of forming a wafer level package includes attaching a laser-activated dielectric material 210 to an integrated circuit substrate 202 to form an assembly 200 (operation 104). Integrated circuit substrate 202 including a plurality of electronic components 204 having terminals 206 on first surfaces 204U thereof.

Figure 4:
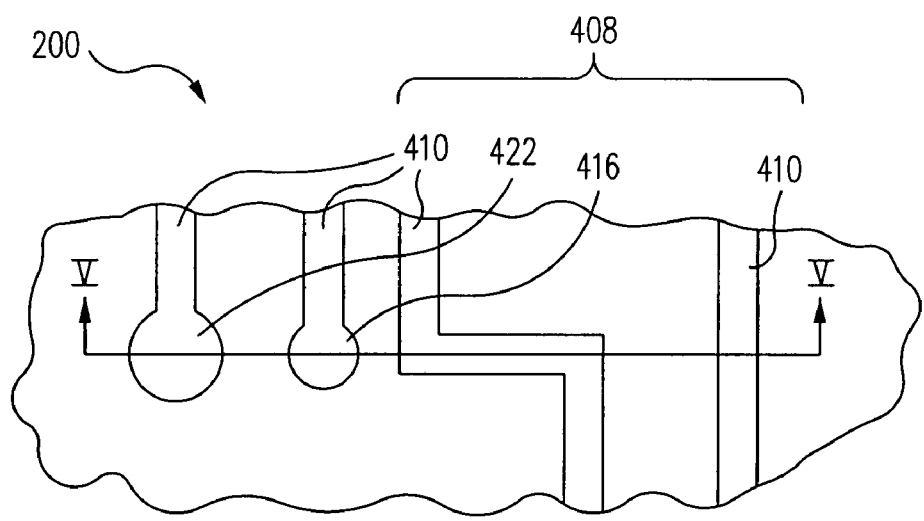
FIG. 4 is a top plan view of the assembly of FIG. 3 at a further stage during fabrication in accordance with one embodiment of the present invention.
Figure 5:
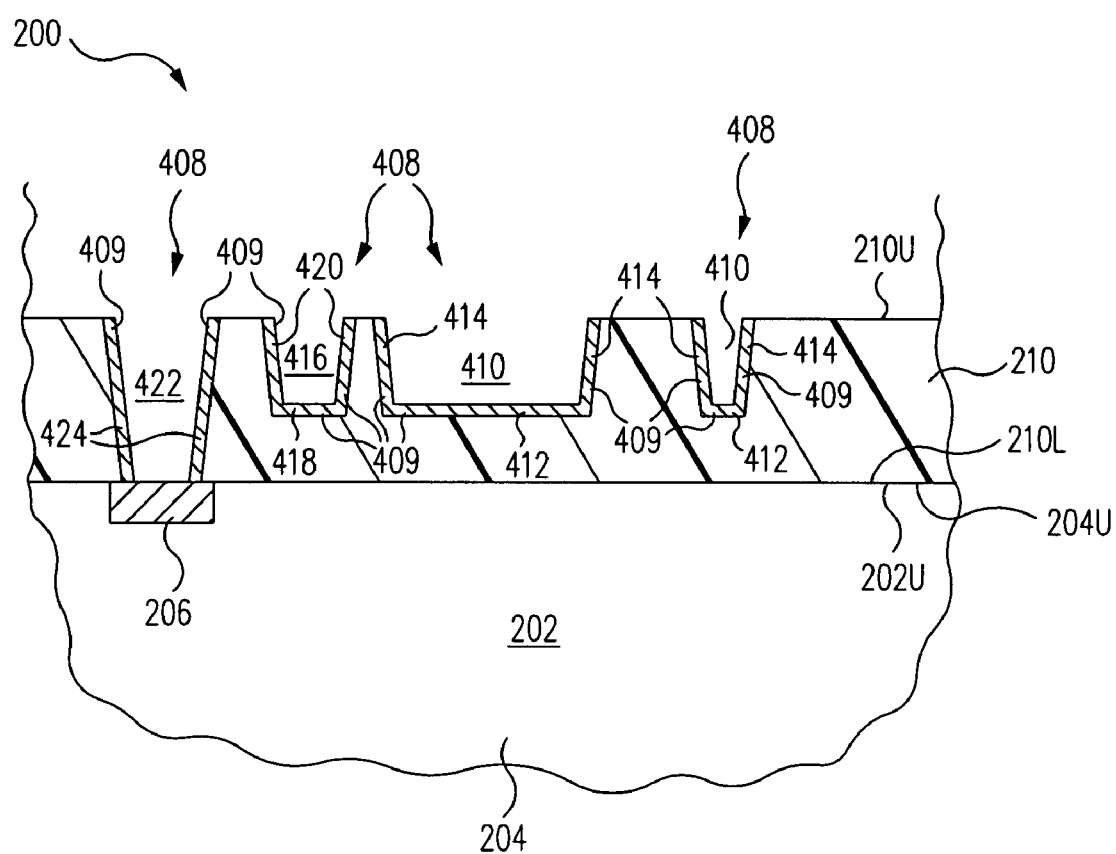
FIG. 5 is a cross-sectional view of the assembly of FIG. 4 along the line V-V in accordance with one embodiment of the present invention.

Referring now to FIGS. 1, 4 and 5 together, laser-activated dielectric material 210 is laser activated and ablated with a laser (operation 106) to form laser-ablated artifacts 408 in laser-activated dielectric material 210 and simultaneously to form an electrically conductive laser-activated layer 409 lining laser-ablated artifacts 408.

Figure 6:
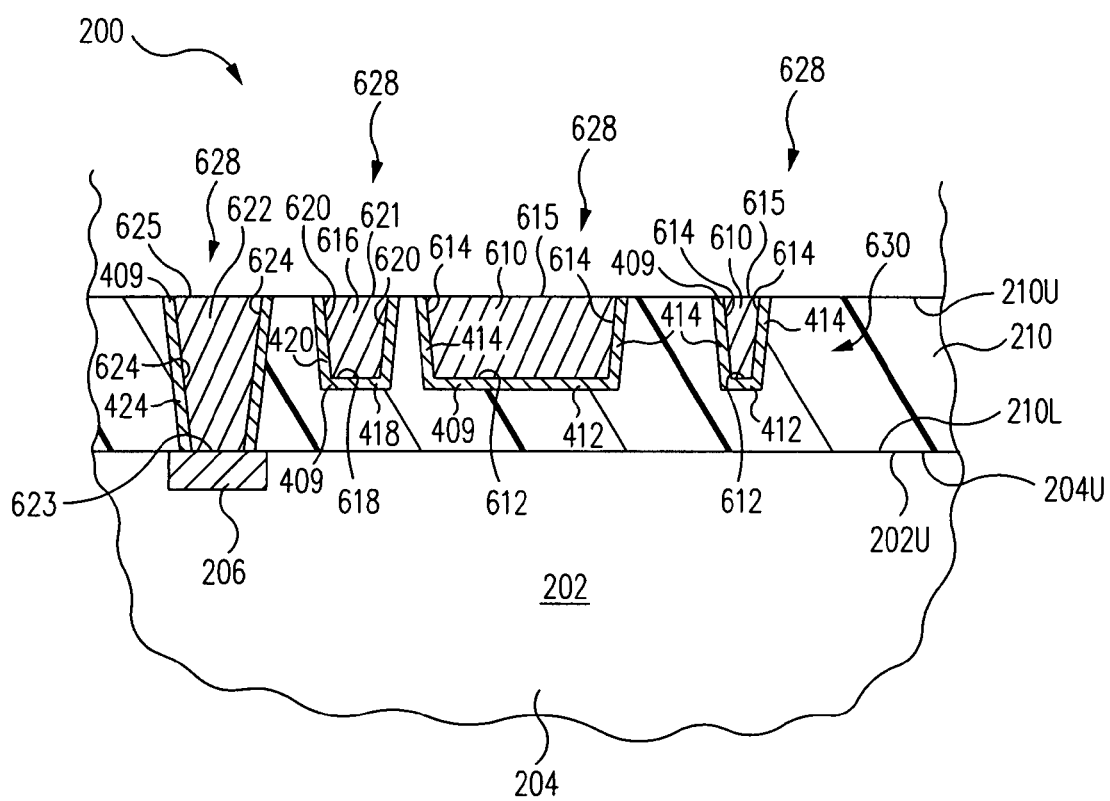
FIG. 6 is a cross-sectional view of the assembly of FIG. 5 at a further stage during fabrication in accordance with one embodiment of the present invention.

Referring now to FIGS. 1, 5 and 6 together, laser-ablated artifacts 408 are filled using an electroless plating process in which an electrically conductive filler material 628 is selectively plated on laser-activated layer 409 to form an embedded circuit pattern 630 within laser-activated dielectric material 210. In the above manner, embedded circuit pattern 630 is formed with a minimal number of operations.

More particularly, FIG. 1 is a wafer level package utilizing laser-activated dielectric material formation method 100 in accordance with one embodiment of the present invention. FIG. 2 is a cross-sectional view of an assembly 200 during fabrication in accordance with one embodiment. FIG. 3 is an enlarged cross-sectional view of a region III of assembly 200 of FIG. 2.

Referring now to FIGS. 1, 2 and 3 together, assembly 200 includes an integrated circuit substrate 202, e.g., a silicon wafer. Integrated circuit substrate 202 includes an upper, e.g., first, surface 202U and a lower, e.g., second, surface 202L opposite upper surface 202U.

Integrated circuit substrate 202, sometimes called an electronic component substrate, includes a plurality of electronic components 204 integrally connected together. Electronic components 204, e.g., integrated circuit chips, sometimes called active components or integrated circuit dies, include upper, e.g., first, surfaces 204U formed on upper surface 202U of integrated circuit substrate 202. Electronic components 204 further include lower, e.g., second, surfaces 204L formed on lower surface 202L of integrated circuit substrate 202. Upper surfaces 204U and lower surfaces 204L are sometimes called active surfaces and inactive surfaces, respectively.

Electronic components 204 further include terminal 206 on upper surfaces 204U of electronic components 204 and generally on upper surface 202U of integrated circuit substrate 202. Terminals 206 are connected to the internal circuitry of electronic components 204. Illustratively, terminals 206 are bond pads, bond pads including metallization, e.g., Under Bump Metallization (UBM) formed thereon, or other electrically conductive material(s).

Electronic components 204 are integrally connected together in an array, e.g., a 2×2, 3×3 . . . or n×m array. Each of electronic components 204 is delineated by a singulation street 208, which is located between adjacent electronic components 204. As discussed below in reference to a singulation operation 114, assembly 200 is singulated along singulation streets 208 resulting in the formation of a plurality of wafer level packages.

From an enter operation 102, flow moves to an attach laser-activated dielectric material to integrated circuit substrate operation 104. In attach laser-activated dielectric material to integrated circuit substrate operation 104, a laser-activated dielectric material 210 is attached to integrated circuit substrate 202.

More particularly, a lower, e.g., first, surface 210L of laser-activated dielectric material 210 is attached to upper surface 202U of integrated circuit substrate 202. Illustratively, laser-activated dielectric material 210 is molded on integrated circuit substrate 202 and thus self adheres. In another embodiment, laser-activated dielectric material 210 is or includes an adhesive, e.g., has a sticky (adhesive) lower surface 210L, and thus self adheres to integrated circuit substrate 202. In yet another embodiment, laser-activated dielectric material 210 is attached to integrated circuit substrate 202 with a separate adhesive. Laser-activated dielectric material 210 further includes an upper, e.g., second, surface 210U opposite lower surface 210L.

Laser-activated dielectric material 210 is an organometallic doped dielectric material, i.e., a dielectric material doped with an organometallic compound, in accordance with one embodiment. More particularly, the organometallic compound is added as an impurity to the dielectric material to alter the properties of the dielectric material, thus forming laser-activated dielectric material 210. Laser-activated dielectric material 210 is sometimes called a doped dielectric material. Although laser-activated dielectric material 210 is set forth herein as being a dielectric material doped with an organometallic compound, in other embodiments, the dielectric material is doped with other laser-activated compounds, which become electrically conductive when laser-activated. For example, the dielectric material is doped with one or more electrolyte materials.

In one embodiment, the dielectric material includes one or more of the following dielectric materials: (1) mold compound; (2) prepreg; (3) dielectric film. In another embodiment, the dielectric material includes thermoset and thermoplastic dielectric materials generally.

As is well known to those of skill in the art, an organometallic compound is an organic compound that includes a metal bonded directly to carbon.

In accordance with one embodiment, properties of suitable organometallic compounds include: (1) the organometallic compound is electrically non-conducting; (2) the organometallic compound is sufficiently soluble and/or colloidal dispersible in a polymer matrix; (3) the organometallic compound does not exhibit catalytic properties; (4) the organometallic compound is separable into metal seeds and organic residuals by laser-ablation; and (5) the organometallic compound has a high thermal resistance.

An example of a suitable organometallic compound is a palladium organometallic compound. In accordance with this embodiment, laser-activated dielectric material 210 is sometimes called a palladium doped dielectric material.

Examples of suitable palladium organometallic compound include: (1) Bis-β-diketonate palladium complex (Pd[R1(CO)CH(CO)R2]2); (2) Tris(4,4'-(2,3 epoxypropoxy)dibenzylideneacetone)Pd(0)(1); (3) Bis(1-phenyl-1,3-butanedionato)Pd(2); and (4) Bis(1,3-diphenyl-1,3-propanedionato)Pd(2).

FIG. 4 is a top plan view of assembly 200 of FIG. 3 at a further stage during fabrication in accordance with one embodiment of the present invention. FIG. 5 is a cross-sectional view of assembly 200 of FIG. 4 along the line V-V in accordance with one embodiment of the present invention.

Referring now to FIGS. 1, 4, and 5 together, from attach laser-activated dielectric material to integrated circuit substrate operation 104, flow moves to a laser-activate and ablate laser-activated dielectric material operation 106. In laser-activate and ablate laser-activated dielectric material operation 106, laser-activated dielectric material 210 is laser-activated and ablated resulting in the formation of laser-ablated artifacts 408 in assembly 200 as illustrated in FIGS. 4 and 5.

Laser-ablated artifacts 408 are formed using a laser-ablation process. During this laser-ablation process, a laser beam is directed at laser-activated dielectric material 210 and moved. The laser beam laser-ablates at least partially, and in some places through, laser-activated dielectric material 210. Accordingly, laser-ablated artifacts 408 are formed at least partially, and in some places through, laser-activated dielectric material 210. As illustrated in FIG. 5, laser-ablated artifacts 408 have a taper profile with the greatest width at upper surface 210U of laser-activated dielectric material 210 due to the laser-ablation process.

Simultaneously, during the laser-ablation process, laser-activated dielectric material 210 is laser-activated to form an electrically conductive laser-activated layer 409 lining laser-ablated artifacts 408. More particularly, the laser energy of the laser that performs the laser-ablation process produces a chemical reduction reaction of the organometallic compound within laser-activated dielectric material 210 thus producing laser-activated layer 409 on the remaining portion of laser-activated dielectric material 210. Accordingly, as discussed in detail below, the various surfaces that define laser-ablated artifacts 408 are electrically conductive, i.e., are defined by laser-activated layer 409.

During the chemical reduction reaction of the organometallic compound, the organometallic compound is reduced by the laser to elemental metal and organic residuals (residues). The elemental metal remains as electrically conductive laser-activated layer 409 within laser-ablated artifacts 408. The organic residuals are volatilized by the laser energy of the laser that performs the laser-ablation process and thus removed from assembly 200.

To illustrate, the following chemical reduction reaction occurs;

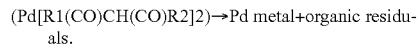

(Pd[R1(CO)CH(CO)R2]2)→Pd metal+organic residuals.

Laser-ablated artifacts 408 include laser-ablated channels, laser-ablated land openings, and/or laser-ablated via apertures. Generally, channels, land openings, and via apertures are particularly shaped laser-ablated voids in assembly 200.

In one embodiment, a laser-ablated channel, sometimes called a trench, extends horizontally and in a direction parallel with upper surface 210U of laser-activated dielectric material 210. In one embodiment, a laser-ablated channel has the width of the laser beam used to form the laser-ablated channel.

To illustrate, laser-ablated artifacts 408 include laser-ablated channels 410. Laser-ablated channels 410 have a uniform width equal to the width of the laser beam used to form laser-ablated channels 410. However, in another embodiment, laser-ablated channels 410 have various widths.

Laser-ablated channels 410 are defined by electrically conductive channel bases 412, i.e., recessed surfaces of integrated circuit substrate 202. Channel bases 412 are recessed below upper surface 210U of laser-activated dielectric material 210. Stated another way, channel bases 412 are between a plane defined by upper surface 210U of laser-activated dielectric material 210 and a plane defined by lower surface 210L of laser-activated dielectric material 210 such that laser-activated dielectric material 210 remains between channel bases 412 and lower surface 210L of laser-activated dielectric material 210.

Laser-ablated channels 410 are further defined by electrically conductive channel sidewalls 414. Channel sidewalls 414 extend between channel bases 412 and upper surface 210U of laser-activated dielectric material 210. Channel sidewalls 414 and channel bases 412 are portions of laser-activated layer 409.

In one embodiment, a laser-ablated land opening is an opening, e.g., a circular, rectangular, or other shaped opening, formed using a repeated, e.g., a trepanning, motion of the laser beam. Accordingly, a laser-ablated land opening has a width greater than the width of the laser beam used to form the laser-ablated land opening in one embodiment.

To illustrate, laser-ablated artifacts 408 include a laser-ablated land opening 416. Laser-ablated land opening 416 is an opening extending partially into laser-activated dielectric material 210.

Laser-ablated land opening 416 is defined by an electrically conductive land opening base 418, i.e., a recessed surface of laser-activated dielectric material 210. Land opening base 418 is recessed below upper surface 210U of laser-activated dielectric material 210. Stated another way, land opening base 418 is between a plane defined by upper surface 210U of laser-activated dielectric material 210 and a plane defined by lower surface 210L of laser-activated dielectric material 210 such that laser-activated dielectric material 210 remains between land opening base 418 and lower surface 210L of laser-activated dielectric material 210.

Laser-ablated land opening 416 is further defined by an electrically conductive land opening sidewall 420. Land opening sidewall 420 extends between land opening base 418 and upper surface 210U of laser-activated dielectric material 210. Land opening sidewall 420 and land opening base 418 are portions of laser-activated layer 409.

In one embodiment, a laser-ablated via opening, sometimes called a laser-ablated via aperture, is an opening (aperture) extending entirely through laser-activated dielectric material 210 in a direction perpendicular to upper surface 210U of laser-activated dielectric material 210.

To illustrate, laser-ablated artifacts 408 include a laser-ablated via opening 422, which is a blind via opening in one embodiment. Laser-ablated via opening 422 is an opening that extends entirely through laser-activated dielectric material 210 and to terminal 206. Accordingly, terminal 206 is exposed through laser-ablated via opening 422 facilitating electrical connection with terminal 206 as discussed below.

Laser-ablated via opening 422 is defined by an electrically conductive via opening sidewall 424 extending between upper surface 210U and lower surface 210L of laser-activated dielectric material 210. Via opening sidewall 424 is a portion of laser-activated layer 409.

Although various laser-ablated artifacts 408 are illustrated in FIGS. 4 and 5, in light of this disclosure, those of skill in the art will understand that any one of a number of laser-ablated artifacts can be formed.

FIG. 6 is a cross-sectional view of assembly 200 of FIG. 5 at a further stage during fabrication in accordance with one embodiment of the present invention. Referring now to FIGS. 1 and 6 together, from laser-activate and ablate laser-activated dielectric material operation 106, flow moves to a fill laser-ablated artifacts operation 108. In fill laser-ablated artifacts operation 108, laser-ablated artifacts 408 are filled with an electrically conductive filler material 628, e.g., copper, to form an embedded circuit pattern 630 within laser-ablated artifacts 408 as illustrated in FIG. 6. More particularly, filler material 628 is within laser-ablated artifacts 408 and is formed directly on laser-activated layer 409.

In accordance with one embodiment, laser-ablated artifacts 408 are filled with filler material 628 using an electroless plating process, in which filler material 628 is selectively plated on laser-activated layer 409.

As laser-activated layer 409 is formed directly from laser-activated dielectric material 210, laser-activated layer 409 has excellent adhesion to laser-activated dielectric material 210. Accordingly, adhesion between laser-activated layer 409/filler material 628 to laser-activated dielectric material 210 is maximized. Generally, there is excellent adhesion between embedded circuit pattern 630 and laser-activated dielectric material 210.

As shown in FIG. 6, embedded circuit pattern 630 is embedded within laser-activated dielectric material 210. Embedded circuit pattern 630 includes electrically conductive traces, lands, and/or vias.

In one embodiment, a trace extends horizontally and in a direction parallel with upper surface 210U of laser-activated dielectric material 210.

To illustrate, embedded circuit pattern 630 includes traces 610 formed within laser-ablated channels 410. Traces 610 include trace bases 612 in direct contact with channel bases 412. Traces bases 612 are recessed below upper surface 210U of laser-activated dielectric material 210. Stated another way, trace bases 612 are between a plane defined by upper surface 210U of laser-activated dielectric material 210 and a plane defined by lower surface 210L of laser-activated dielectric material 210 such that laser-activated dielectric material 210 remains between trace bases 612 and lower surface 210L of laser-activated dielectric material 210.

Traces 610 further include trace sidewalls 614 in direct contact with channel sidewalls 414. Traces sidewalls 614 extend between trace bases 612 and upper surface 210U of laser-activated dielectric material 210. Traces 610 further include trace top surfaces 615 coplanar with upper surface 210U of laser-activated dielectric material 210.

To further illustrate, embedded circuit pattern 630 includes a land 616 formed within laser-ablated land opening 416. Land 616 includes a land base 618 in direct contact with land opening base 418. Land base 618 is recessed below upper surface 210U of laser-activated dielectric material 210. Stated another way, land base 618 is between a plane defined by upper surface 210U of laser-activated dielectric material 210 and a plane defined by lower surface 210L of laser-activated dielectric material 210 such that laser-activated dielectric material 210 remains between land base 618 and lower surface 210L of laser-activated dielectric material 210.

Land 616 further includes a land sidewall 620 in direct contact with land opening sidewall 420. Land sidewall 620 extends between land base 618 and upper surface 210U of laser-activated dielectric material 210. Land 616 further includes land top surface 621 coplanar with upper surface 210U of laser-activated dielectric material 210.

To further illustrate, embedded circuit pattern 630 includes a via 622, e.g., a blind via, formed within laser-ablated via opening 422. Via 622 includes a via sidewall 624 in direct contact with via opening sidewall 424. Via sidewall 624 extends between upper surface 210U and lower surface 210L of laser-activated dielectric material 210. Via 622 further includes a via base surface 623 coplanar with lower surface 210L of laser-activated dielectric material 210. Via base surface 623 is formed directly on terminal 206 such that via 622 is electrically connected to terminal 206. Via 622 further includes a via top surface 625 coplanar with upper surface 210U of laser-activated dielectric material 210.

Although various features of embedded circuit pattern 630 are illustrated in FIG. 6, in light of this disclosure, those of skill in the art will understand that embedded circuit pattern 630 is formed with any one of a number of electrically conductive features in other embodiments.

In the above manner, embedded circuit pattern 630 is formed with a minimal number of operations. Accordingly, the amount of factory floor space, engineering support, management, and direct labor needed to form assembly 200 is minimized. Further, yield and throughput are maximized. Further still, design rules are improved.

Figure 7:
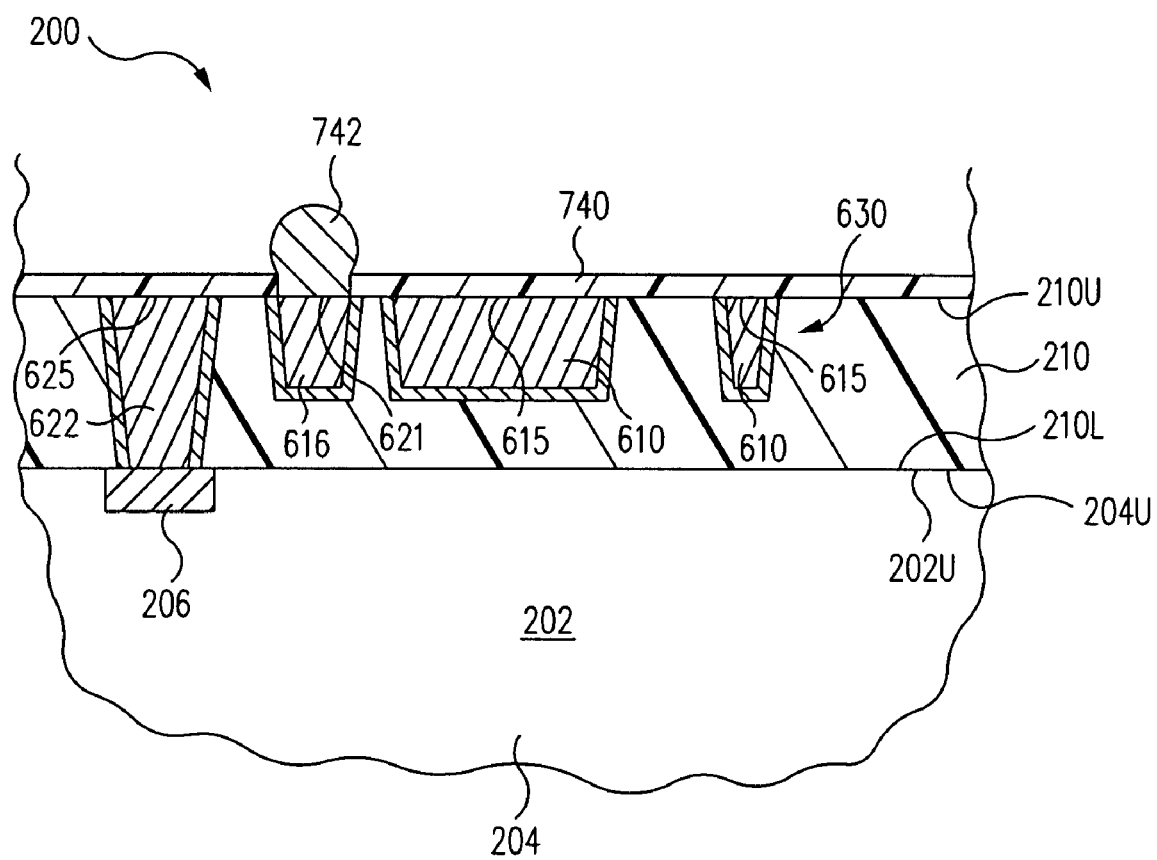
FIG. 7 is a cross-sectional view of the assembly of FIG. 6 at a further stage during fabrication in accordance with one embodiment of the present invention.

FIG. 7 is a cross-sectional view of assembly 200 of FIG. 6 at a further stage during fabrication in accordance with one embodiment of the present invention. Referring now to FIGS. 1 and 7 together, from fill laser-ablated artifacts operation 108, flow moves, optionally, to a form upper surface passivation layer operation 110. In form upper surface passivation layer operation 110, a passivation layer 740 is formed on upper surface 210U of laser-activated dielectric material 210. Passivation layer 740 is a dielectric material.

Passivation layer 740 covers embedded circuit pattern 630, except where electrical connection to embedded circuit pattern 630 is necessary. To illustrate, passivation layer 740 is not formed on land top surface 621 of land 616, exposing land top surface 621 for electrical connection thereto as discussed further below.

From form upper surface passivation layer operation 110, flow moves, optionally, to a form interconnection balls operation 112. In form interconnection balls operation 112, interconnection balls, e.g., solder balls, are formed on embedded circuit pattern 630. More particularly, the interconnection balls are electrically connected to embedded circuit pattern 630.

To illustrate, an interconnection ball 742 is formed on and electrically connected to land top surface 621 of land 616, which is exposed by passivation layer 740. Interconnection balls are used to connect the wafer level package to a larger substrate, e.g., to a printed circuit motherboard.

In one embodiment, the interconnection balls are distributed in an array thus forming a ball grid array (BGA) package. In other embodiments, other types of packages are formed, e.g., a metal land grid array (LGA) type package or a leadless chip carrier (LCC) type package or other type of package and thus form interconnection balls operation 112 is optional.

FIG. 7 illustrates an example where the pattern of terminals 206 is redistributed to the pattern of interconnection balls 742. Accordingly, the wafer level packages are sometimes called redistribution layer (RDL) type packages.

Figure 8:
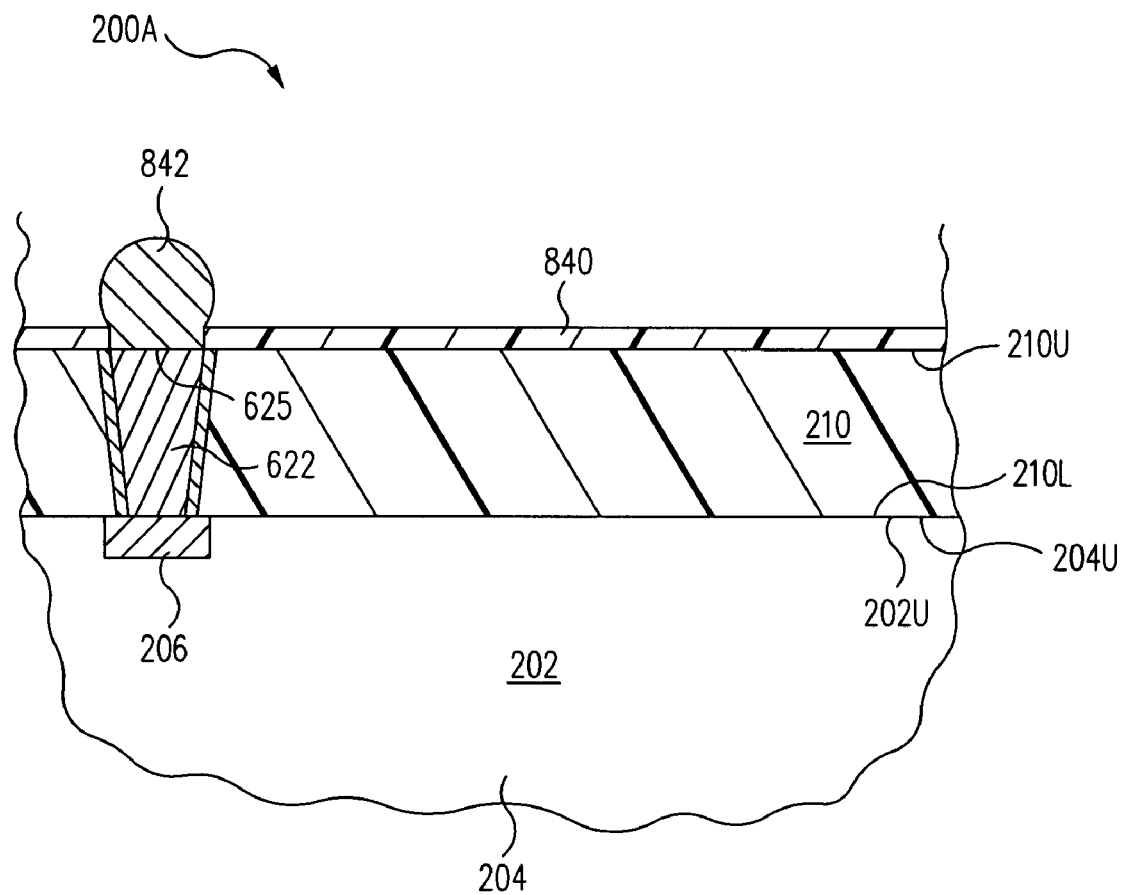
FIG. 8 is a cross-sectional view of an assembly during fabrication in accordance with another embodiment of the present invention.

FIG. 8 is a cross-sectional view of an assembly 200A during fabrication in accordance with another embodiment of the present invention. Assembly 200A of FIG. 8 is similar to assembly 200 of FIG. 7 but has an absence of traces 610 and lands 616 in accordance with this embodiment. Only the significant differences between assembly 200A of FIG. 8 and assembly 200 of FIG. 7 are discussed below.

In accordance with this embodiment, an interconnection ball 842 is formed on and electrically connected to via top surface 625 of via 622, which is exposed from a passivation layer 840. Interconnect ball 842 and passivation layer 840 of FIG. 8 are similar to interconnection ball 742 and passivation layer 740 of FIG. 7 and so are not discussed in detail.

FIG. 8 illustrates an example where the pattern of interconnection balls 842 is the same as the pattern of terminals 206. This minimizes the length of the electrically conductive pathway between interconnection balls 842 and terminals 206 thus maximizing the electrical performance of the wafer level package.

Flow moves from form interconnection balls operation 112 (or directly from operation 110 if operation 112 is not performed, or directly from operation 108 if operations 110, 112 are not performed), to a singulation operation 114. In singulation operation 114, assembly 200 of FIG. 7 (or 200A of FIG. 8) is singulated along singulation streets 208 (see FIG. 2) thus forming a plurality of individual wafer level packages. From singulation operation 114, flow moves to and exits at an exit operation 116.

Although wafer level package utilizing laser-activated dielectric material formation method 100 is set forth above as being performed on assembly 200 comprising a plurality of electronic components 204, in another embodiment, the operations are performed on a single electronic component 204 thus forming the wafer level packages individually. In accordance with this embodiment, singulation operation 114 is performed at an earlier stage of fabrication to singulate electronic components 204 from one another.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method of forming a wafer level package comprising:
   attaching a laser-activated dielectric material to an integrated circuit substrate, the integrated circuit substrate comprising terminals on a first surface thereof; and
   laser activating and ablating the laser-activated dielectric material with a laser to form laser-ablated artifacts in the laser-activated dielectric material and simultaneously to form an electrically conductive laser-activated layer lining the laser-ablated artifacts.

2. The method of claim 1 wherein the laser-activated dielectric material is an organometallic doped dielectric material.

3. The method of claim 2 wherein the organometallic doped dielectric material comprises a dielectric material doped with an organometallic compound.

4. The method of claim 3 wherein the dielectric material is selected from the group consisting of mold compound, prepreg, film, thermoset dielectric material, and thermoplastic dielectric material.

5. The method of claim 3 wherein the organometallic compound comprises an organic compound that includes a metal.

6. The method of claim 3 wherein the organometallic compound is separable into metal seeds and organic residuals by laser-ablation.

7. The method of claim 3 wherein the organometallic compound comprises a palladium organometallic compound.

8. The method of claim 7 wherein the palladium organometallic compound is selected from the group consisting of: (1) Bis-g-diketonate palladium complex (Pd[R1(CO)CH(CO)R2]2); (2) Tris(4,4'-(2,3 epoxypropoxy)dibenzylideneacetone)Pd(O)(1); (3) Bis(1-phenyl-1,3-butanedionato)Pd(2); and (4) Bis(1,3-diphenyl-1,3-propanedionato)Pd(2).

9. The method of claim 3 wherein laser energy from the laser produces a chemical reduction reaction of the organometallic compound thus producing the laser-activated layer lining the laser-ablated artifacts.

10. The method of claim 1 wherein the laser-activated dielectric material is molded on the integrated circuit substrate.

11. The method of claim 1 wherein the laser-ablated artifacts comprise laser-ablated via openings extending through the laser-activated dielectric material to the terminals, the terminals being exposed through the laser-ablated via openings.

12. The method of claim 1 wherein the laser-ablated artifacts comprise laser-ablated channels extending partially into the laser-activated dielectric material, the laser-activated dielectric material remaining between the channels and the integrated circuit substrate.

13. The method of claim 1 wherein the laser-ablated artifacts comprise laser-ablated land openings extending partially into the laser-activated dielectric material, the laser-activated dielectric material remaining between the laser-ablated land openings and the integrated circuit substrate.

14. The method of claim 1 further comprising filling the laser-ablated artifacts with an electrically conductive filler material to form an embedded circuit pattern within the laser-activated dielectric material.

15. The method of claim 14 wherein the filling is performed using an electroless plating process in which the filler material is selectively plated on the laser-activated layer.

16. The method of claim 14 further comprising forming a passivation layer on the laser-activated dielectric material.

17. The method of claim 14 further comprising forming interconnection balls electrically connected to the embedded circuit pattern.

18. The method of claim 1 wherein the laser-activated dielectric material comprises a dielectric material doped with a laser-activated compound, the laser-activated compound becoming electrically conductive when laser-activated.

19. A method of forming a wafer level package comprising:
attaching a laser-activated dielectric material to an integrated circuit substrate to form an assembly, the integrated circuit substrate comprising a plurality of electronic components comprising terminals on first surfaces thereof;
laser activating and ablating the laser-activated dielectric material with a laser to form laser-ablated artifacts in the laser-activated dielectric material and simultaneously to form an electrically conductive laser-activated layer lining the laser-ablated artifacts; and
filling the laser-ablated artifacts using an electroless plating process in which an electrically conductive filler material is selectively plated on the laser-activated layer to form an embedded circuit pattern within the laser-activated dielectric material.

20. The method of claim 19 further comprising singulating the assembly to form the wafer level package.

21. A wafer level package comprising:
an electronic component comprising a first surface having terminals thereon;
a laser-activated dielectric material attached to the first surface;
laser-ablated artifacts in the laser-activated dielectric material, the laser-ablated artifacts being lined with a laser-activated layer formed from the laser-activated dielectric material, wherein the laser-ablated artifacts comprise laser-ablated via openings exposing the terminals; and
an embedded circuit pattern within the laser-ablated artifacts and being electrically connected to the terminals.

22. An assembly comprising:
an integrated circuit substrate comprising a plurality of electronic components, the electronic components comprising first surfaces having terminals thereon;
a laser-activated dielectric material attached to the integrated circuit substrate;
laser-ablated artifacts in the laser-activated dielectric material, the laser-ablated artifacts being lined with a laser-activated layer formed from the laser-activated dielectric material, wherein the laser-ablated artifacts comprise laser-ablated via openings exposing the terminals; and
embedded circuit patterns within the laser-ablated artifacts and being electrically connected to the terminals, the embedded circuit patterns comprising electrically conductive traces, lands and vias.

23. A method of forming a wafer level package comprising:
molding a laser-activated dielectric material to an electronic component, the electronic component comprising terminals on a first surface thereof; and
laser activating and ablating the laser-activated dielectric material with a laser to form laser-ablated artifacts in the laser-activated dielectric material and simultaneously to form an electrically conductive laser-activated layer lining the laser-ablated artifacts, wherein the laser-ablated artifacts comprise:
laser-ablated via openings extending through the laser-activated dielectric material to the terminals, the terminals being exposed through the laser-ablated via openings; and
laser-ablated channels extending partially into the laser-activated dielectric material, the laser-activated dielectric material remaining between the channels and the electronic component.

24. The method of claim 23 wherein the laser-activated dielectric material comprises a dielectric material doped with a laser-activated compound, the laser-activated compound becoming electrically conductive when laser-activated.

25. The method of claim 23 further comprising filling the laser-ablated artifacts with an electrically conductive filler material using an electroless plating process in which the filler material is selectively plated on the laser-activated layer to form an embedded circuit pattern within the laser-activated dielectric material.

* * * * *

UNITED STATES PATENT AND TRADEMARK OFFICE
CERTIFICATE OF CORRECTION

PATENT NO.       : 7,632,753 B1                                                Page 1 of 1
APPLICATION NO.  : 11/867293
DATED            : December 15, 2009
INVENTOR(S)      : Sukianto Rusli, Bob Shih-Wei Kuo and Ronald Patrick Huemoeller It is certified that error appears in the above-identified patent and that said Letters Patent is hereby corrected as shown below:

In Column 8, Claim 8, Line 59, replace "Bis-g-diketonate" with --Bis-β-diketonate--; and
In Column 8, Claim 8, Line 61, replace "Pd(O)(1)" with --Pd(0)(1)--;

Signed and Sealed this

Sixteenth Day of March, 2010

David J. Kappos
*Director of the United States Patent and Trademark Office*